United States Patent
Choi et al.

(10) Patent No.: US 12,120,907 B2
(45) Date of Patent: Oct. 15, 2024

(54) ELECTROLUMINESCENT DISPLAY APPARATUS

(71) Applicant: LG Display Co., Ltd., Seoul (KR)

(72) Inventors: Wonjin Choi, Seoul (KR); GeeSung Chae, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/703,139

(22) Filed: Dec. 4, 2019

(65) Prior Publication Data
US 2020/0185648 A1    Jun. 11, 2020

(30) Foreign Application Priority Data

Dec. 5, 2018   (KR) .......................... 10-2018-0155378

(51) Int. Cl.
*H10K 50/844*     (2023.01)
*H10K 59/80*      (2023.01)
(Continued)

(52) U.S. Cl.
CPC ..... *H10K 50/8445* (2023.02); *H10K 59/8731* (2023.02); *H10K 59/12* (2023.02); *H10K 2102/00* (2023.02)

(58) Field of Classification Search
CPC ..... H01L 51/56; H01L 23/3155; H01L 23/16; H01L 23/28; H01L 33/52; H01L 51/107; H01L 51/448; H01L 51/5256; H01L 2251/30; H01L 27/3244; H01L 27/156; H01L 33/54; H01L 33/56; H10K 50/8445; H10K 2102/00; H10K 59/8731; H10K 59/12
See application file for complete search history.

(56) References Cited

U.S. PATENT DOCUMENTS 7,492,432 B2    2/2009  Park et al.
7,645,478 B2 *  1/2010  Thelss ............... H01L 51/0013
                                                     428/917
(Continued)

FOREIGN PATENT DOCUMENTS

CN    1797152 A      7/2006
CN    101847652 A    9/2010
(Continued)

OTHER PUBLICATIONS

Chinese Office Action dated Jun. 15, 2022 issued in corresponding Patent Application No. 201910604065.X, w/ English Translation (19 pages).

(Continued)

*Primary Examiner* — Dale E Page
*Assistant Examiner* — Quovaunda Jefferson
(74) *Attorney, Agent, or Firm* — POLSINELLI PC (57) ABSTRACT

An electroluminescent display apparatus includes a substrate, a plurality of light emitting elements disposed on a flexible substrate, and an encapsulating unit disposed on the plurality of light emitting elements. The encapsulating unit includes a first encapsulating layer, a second encapsulating layer, and a third encapsulating layer, and at least one of the first encapsulating layer, the second encapsulating layer, and the third encapsulating layer is patterned to have a plurality of patterns which are isolated and independent from each other.

12 Claims, 7 Drawing Sheets

(51) Int. Cl.
    *H10K 102/00*          (2023.01)
    *H10K 59/12*           (2023.01)

(56) References Cited

U.S. PATENT DOCUMENTS

| | | | | |
|---|---|---|---|---|
| 9,054,300 | B2* | 6/2015 | Annunziata | H01L 43/12 |
| 9,252,395 | B2* | 2/2016 | Oh | H10K 50/8445 |
| 2007/0170454 | A1* | 7/2007 | Andrews | H01L 33/52 |
| | | | | 257/100 |
| 2008/0210936 | A1* | 9/2008 | Kobayashi | H01L 31/036 |
| | | | | 257/51 |
| 2008/0218066 | A1* | 9/2008 | Kim | H01L 51/5231 |
| | | | | 313/504 |
| 2010/0109025 | A1* | 5/2010 | Bhat | H01L 33/507 |
| | | | | 257/88 |
| 2010/0157585 | A1* | 6/2010 | Diekmann | F21V 9/08 |
| | | | | 362/228 |
| 2010/0253215 | A1* | 10/2010 | Fukagawa | H10K 50/844 |
| | | | | 313/504 |
| 2013/0208442 | A1* | 8/2013 | Reiherzer | F21K 9/64 |
| | | | | 362/84 |
| 2015/0340652 | A1* | 11/2015 | Oh | H10K 71/00 |
| | | | | 257/40 |
| 2016/0028043 | A1* | 1/2016 | Kwon | H10K 50/844 |
| | | | | 257/40 |
| 2016/0306472 | A1* | 10/2016 | Park | G06F 3/0446 |
| 2017/0069808 | A1* | 3/2017 | Kim | H01L 27/1248 |
| 2017/0279057 | A1* | 9/2017 | Park | H10K 59/353 |

FOREIGN PATENT DOCUMENTS

| | | |
|---|---|---|
| CN | 104409455 A | 3/2015 |
| CN | 105276537 A | 1/2016 |
| CN | 105576000 A | 5/2016 |
| CN | 106057845 A | 10/2016 |
| CN | 107221550 A | 9/2017 |
| CN | 107240596 A | 10/2017 |
| JP | 2005-157141 A | 6/2005 |
| KR | 10-2014-0034600 A | 3/2014 |
| KR | 10-2015-0135721 A | 12/2015 |
| KR | 10-2016-0053356 A | 5/2016 |

OTHER PUBLICATIONS

Chinese Notice of Allowance dated Jul. 1, 2023 issued in Patent Application No. 201910604065.X w/English Translation (6 pages).
Korean Office Action dated Jul. 20, 2023 issued in Patent Application No. 10-2018-0155378 w/English Translation (14 pages).

* cited by examiner

ELECTROLUMINESCENT DISPLAY APPARATUS

CROSS-REFERENCE TO RELATED APPLICATION

This application claims the priority of Korean Patent Application No. 10-2018-0155378 filed on Dec. 5, 2018, in the Korean Intellectual Property Office, which is incorporated herein by reference in its entirety.

BACKGROUND

Field of the Disclosure

The present disclosure relates to an electroluminescent display apparatus, and more particularly, to an electroluminescent display apparatus including an encapsulating unit having an improved structure.

Description of the Background

As it enters a full-fledged information age, a display apparatus which visually displays electrical information signals has rapidly developed to be applied to various electronic devices such as a smart phone, a tablet, a laptop computer, a monitor, and a television.

As a specific example of the display apparatus, there are a liquid crystal display device (LCD), a field emission display device (FED), and an organic light emitting display device (OLED).

The electroluminescent display apparatus including an organic light emitting display device is a self-emitting display apparatus so that a separate light source is not necessary, which is different from the liquid crystal display device. Therefore, the electroluminescent display apparatus may be manufactured to be thin and light. Further, since the electroluminescent display apparatus is advantageous not only in terms of power consumption due to the low voltage driving, but also in terms of color implementation, a response speed, a viewing angle, a contrast ratio (CR), it is expected to be utilized in various fields.

In the electroluminescent display apparatus, an emissive layer EML using an organic material is disposed between two electrodes formed of an anode and a cathode. When holes in the anode are injected to the emissive layer and electrons in the cathode are injected to the emissive layer, the injected holes and electrons are recombined and form excitons in the emissive layer to emit light.

The emissive layer includes a host material and a dopant material so that interactions between two materials occur. The host material serves to generate excitons from the electrons and holes and transmit energy to the dopant material. The dopant material is a dye organic material and a small amount of dopant material is added to receive energy from the host material and convert the energy into light.

The electroluminescent display apparatus including an emissive layer formed of an organic material is encapsulated with glass, metal, or a film to suppress moisture or contaminants from entering into the electroluminescent display apparatus from the outside. Therefore, oxidation of the emissive layer and the electrode is suppressed and the emissive layer and the electrode are protected from a mechanical or physical impact applied from the outside.

SUMMARY

A recent display apparatus which becomes thinner and lighter is more vulnerable to a mechanical or physical impact which is applied from the outside to the inside of the display apparatus or to penetration of moisture and contaminants, so that it is actively being studied.

When the impact is applied to the electroluminescent display apparatus from the outside, cracks may be generated in an encapsulating unit which is disposed to encapsulate the electroluminescent display apparatus. In this case, when the crack generated due to the impact is propagated to the surrounding area, the moisture or contaminants penetrate into the electroluminescent display apparatus from the outside to cause a defect.

Therefore, the inventors of the present disclosure recognized the problem of the crack propagation occurred in the encapsulating unit of the electroluminescent display apparatus and invented an electroluminescent display apparatus including an encapsulating unit having an improved structure against the impact applied from the outside.

The present disclosure is not limited to the above-mentioned objects, and other objects, which are not mentioned above, can be clearly understood by those skilled in the art from the following descriptions.

An electroluminescent display apparatus according to an exemplary aspect of the present disclosure is provided. The electroluminescent display apparatus includes a substrate, a plurality of light emitting elements disposed on a flexible substrate, and an encapsulating unit disposed on the plurality of light emitting elements. The encapsulating unit includes a first encapsulating layer, a second encapsulating layer, and a third encapsulating layer, and at least one of the first encapsulating layer, the second encapsulating layer, and the third encapsulating layer may be patterned to have a plurality of patterns which are isolated and independent from each other.

According to another aspect of the present disclosure, the first encapsulating layer and the third encapsulating layer may be configured by silicon oxide SiOx or silicon nitride SiNx.

According to still another aspect of the present disclosure, the second encapsulating layer may be configured by one of silicon oxycarbide (SiOCz), acryl, and epoxy-based resin.

According to still another aspect of the present disclosure, the second encapsulating layer may be configured by silicon oxide SiOx or silicon nitride SiNx.

According to still another aspect of the present disclosure, each of the first encapsulating layer, the second encapsulating layer, and the third encapsulating layer may be patterned to have a plurality of patterns which are isolated and independent from each other.

According to still another aspect of the present disclosure, at least one side of the first encapsulating layer, the second encapsulating layer, and the third encapsulating layer may have the same end.

According to still another aspect of the present disclosure, the first encapsulating layer, each of the plurality of patterns may be formed of an island shape.

According to still another aspect of the present disclosure, the first encapsulating layer and the third encapsulating layer may be in contact with each other at an end and enclose, cover or surround the second encapsulating layer therein.

According to still another aspect of the present disclosure, the first encapsulating layer may be patterned to have a plurality of patterns which are isolated and independent from each other and the second encapsulating layer and the third encapsulating layer are extended to cover the plurality of patterns of the first encapsulating layer.

According to still another aspect of the present disclosure, the plurality of patterns may be disposed on the plurality of light emitting elements in one-to-one correspondence, or each of the plurality of patterns may cover at least one light emitting element among the plurality of light emitting elements.

According to the present disclosure, in the electroluminescent display apparatus, the crack which is caused by the impact applied from the outside does not propagate so that the defect caused by the penetration of the moisture or the contaminants from the outside may be avoided.

The effects according to the exemplary aspects of the present disclosure are not limited to the contents exemplified above, and more various effects are included in the present specification.

The scope of the claims is not limited by the matters described in the description of the specification, as the contents of the description in the problems, the solutions to the problems, and the effects described above do not specify the essential features of the claims.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or layer or there between.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

Figure 1:
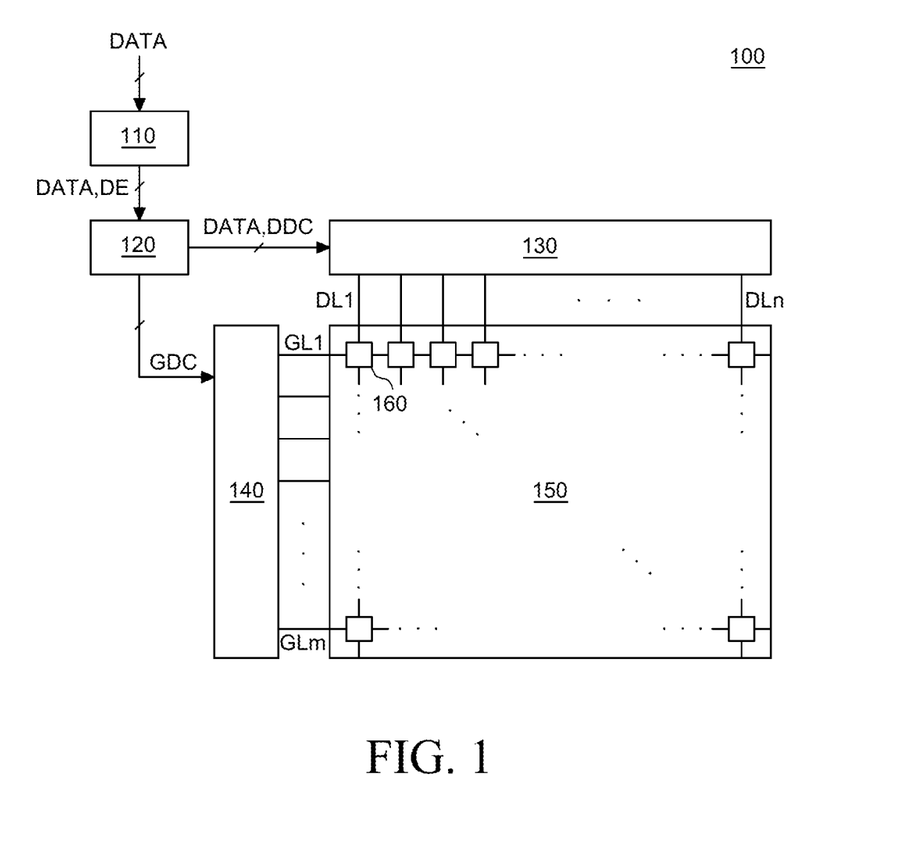
FIG. 1 is a block diagram of a display apparatus according to an exemplary aspect of the present disclosure.

FIG. 1 is a block diagram of a display apparatus according to an exemplary aspect of the present disclosure.

Referring to FIG. 1, a display apparatus 100 includes an image processing unit 110, a timing controller 120, a data driver 130, a gate driver 140, and a display panel 150.

The image processing unit 110 outputs a data enable signal DE together with a data signal DATA supplied from the outside. The image processing unit 110 may output a driving signal such as one or more of a vertical synchronization signal, a horizontal synchronization signal, and a clock signal in addition to the data enable signal DE.

The timing controller 120 is supplied with the data signal DATA together with the data enable signal DE or a driving signal including the vertical synchronization signal, the horizontal synchronization signal, and the clock signal from the image processing unit 110. The timing controller 120 outputs a gate timing control signal GDC for controlling an operation timing of the gate driver 140 and a data timing control signal DDC for controlling an operation timing of the data driver 130, based on the driving signal.

The data driver 130 samples and latches the data signal DATA supplied from the timing controller 120 in response to the data timing control signal DDC supplied from the timing controller 120 to convert the data signal into a gamma reference voltage and output the converted gamma reference voltage. The data driver 130 outputs the data signal DATA through data lines DL1 to DLn.

The gate driver 140 outputs the gate signal while shifting a level of the gate voltage in response to the gate timing control signal GDC supplied from the timing controller 120. The gate driver 140 outputs the gate signal through the gate lines GL1 to GLm.

The display panel 150 displays an image while the pixels 160 emit light in response to the data signal DATA and the gate signal supplied from the data driver 130 and the gate driver 140. A detailed structure of the pixel 160 will be described with reference to FIGS. 2 and 4.

Figure 2:
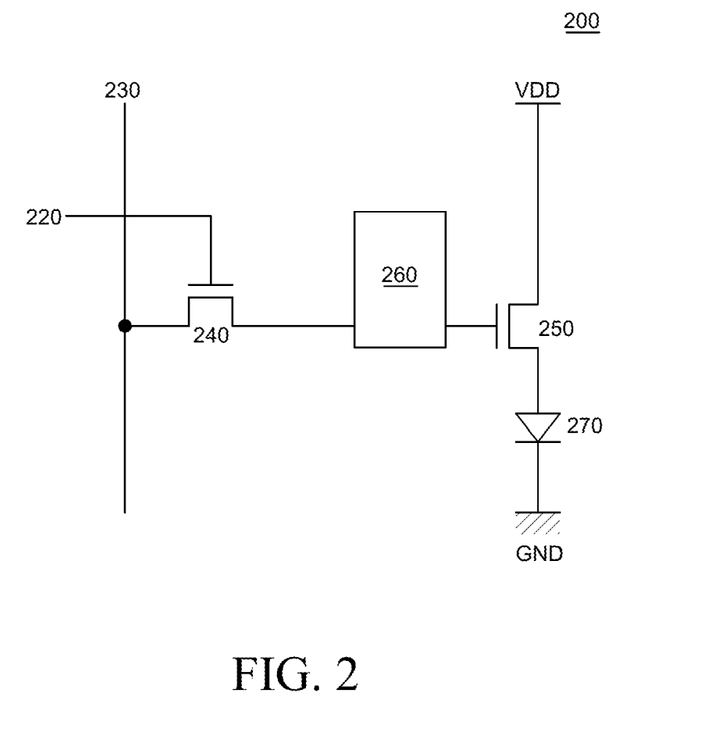
FIG. 2 is a circuit diagram of a pixel of a display apparatus according to an exemplary aspect of the present disclosure.

FIG. 2 is a circuit diagram of a pixel of a display apparatus according to an exemplary aspect of the present disclosure.

Referring to FIG. 2, the pixel included in the display apparatus 200 includes a switching transistor 240, a driving transistor 250, a compensating circuit 260, and a light emitting element 270.

The light emitting element 270 may operate to emit light in accordance with a driving current formed by the driving transistor 250.

The switching transistor 240 may perform a switching operation such that a data signal supplied through the data line 230 is stored in a capacitor (not shown in FIG. 2) as a data voltage in response to a gate signal supplied through the gate line 220.

The driving transistor 250 operates such that a constant driving current flows between a high potential power line VDD and a low potential power line GND in response to the data voltage stored in the capacitor.

The compensating circuit 260 is a circuit for compensating a threshold voltage of the driving transistor 250 and includes one or more thin film transistors and capacitors. A configuration of the compensating circuit may vary depending on a compensating method.

The pixel of the electroluminescent display apparatus 200 may be configured by a 2T (transistor) 1C (capacitor) structure including a switching transistor 240, a driving transistor 250, a capacitor, and a light emitting element 270, without the compensating circuit 260. When the compensating circuit 260 is added, the pixel of the electroluminescent display apparatus 200 may be formed in various forms such as 3T1C, 4T2C, 5T2C, 6T1C, 6T2C, 7T1C, and 7T2C, and the present disclosure is not limited thereto.

Figure 3:
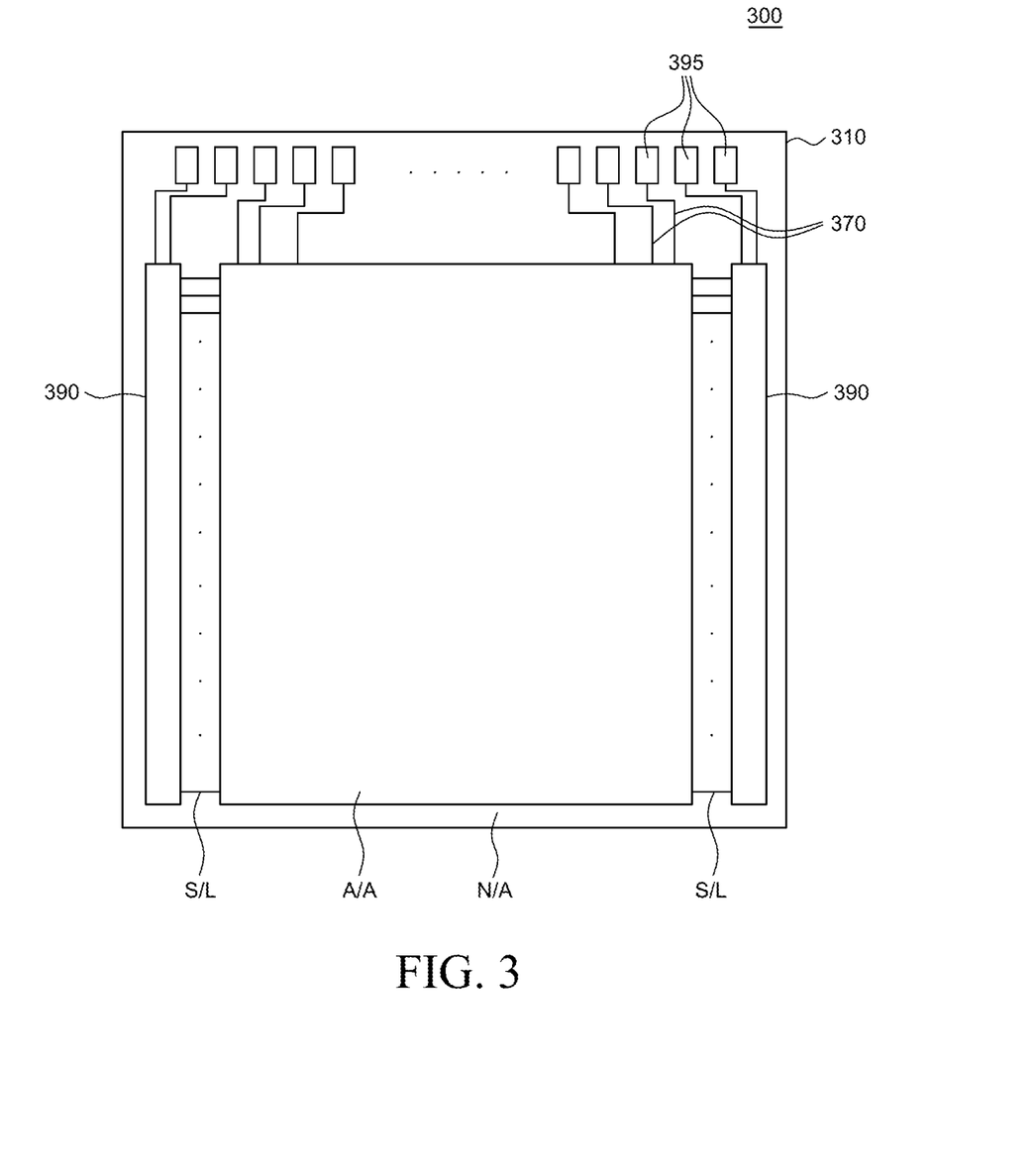
FIG. 3 is a plan view of a display apparatus according to an exemplary aspect of the present disclosure.

FIG. 3 is a plan view of a display apparatus according to an exemplary aspect of the present disclosure.

Referring to FIG. 3, a display apparatus 300 includes an active area A/A in which a pixel which actually emits light through a thin film transistor and a light emitting element is disposed on a substrate 310 and a non-active area N/A enclosing an outer periphery of an edge of the active area A/A.

In the non-active area N/A of the substrate 310, a circuit such as a gate driving unit 390 for driving the display apparatus 300 and various signal lines such as a scan line S/L may be disposed. The circuit for driving may be disposed on the substrate 310 in a gate in panel manner (GIP) or connected to the substrate 310 in a tape carrier package (TCP) or chip on film (COF) manner.

A pad 395 is disposed at one side of the substrate 310 of the non-active area N/A. The pad 395 is a metal pattern to which an external module is bonded.

Various wiring lines are formed on the substrate 310. The wiring lines may be formed in the active area A/A of the substrate 310. Alternatively, a circuit line 370 formed in the non-active area N/A connects the driving circuit, the gate driver or the data driver to transmit a signal.

The circuit line 370 is formed of a conductive material and may be formed of a conductive material having excellent ductility to reduce the crack generated at the time of bending the substrate 310. For example, the circuit line 370 may be formed of a conductive material having excellent ductility such as gold (Au), silver (Ag), and aluminum (Al) and formed of one of various conductive materials used in the active area A/A. The circuit line 370 may also be configured by molybdenum (Mo), chrome (Cr), titanium (Ti), nickel (Ni), neodymium (Nd), copper (Cu), and an alloy of silver (Ag) and magnesium (Mg).

The circuit line 370 may be configured by a multi-layered structure including various conductive materials and for example, configured by a triple-layered structure of titanium (Ti)/aluminum (Al)/titanium (Ti), but is not limited thereto.

Figure 4:
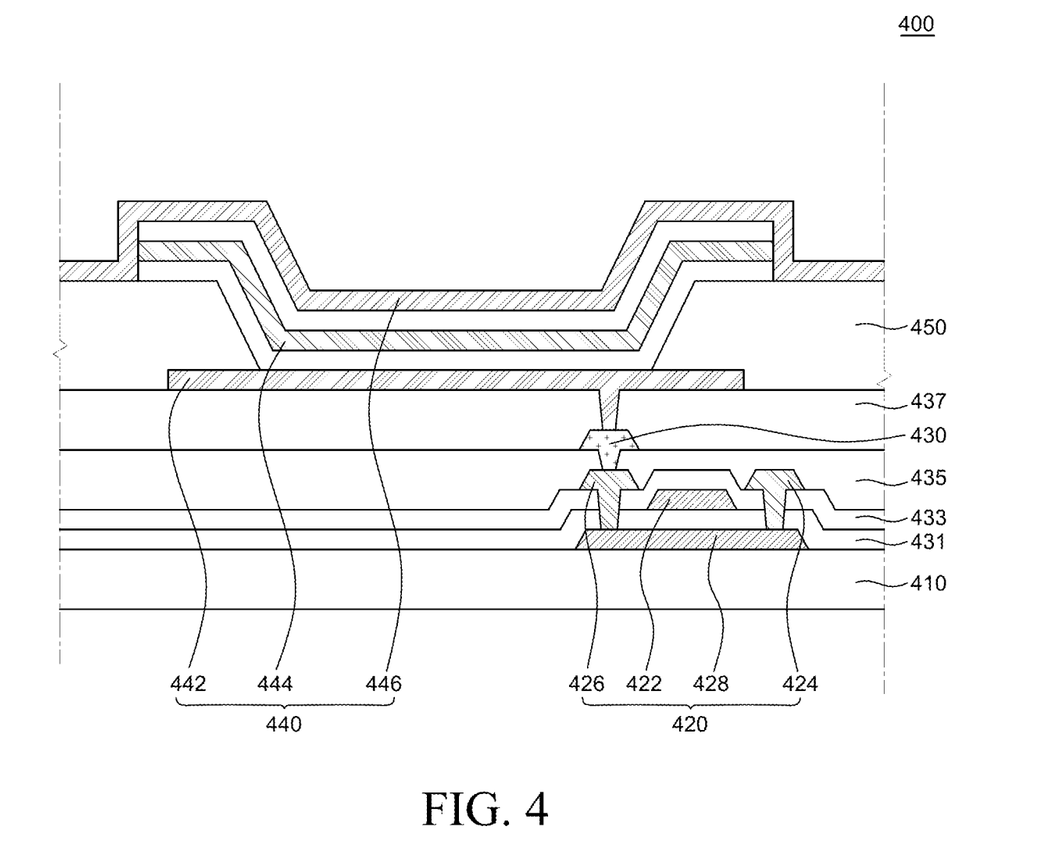
FIG. 4 is a cross-sectional view of an active area of a display apparatus according to an exemplary aspect of the present disclosure.

FIG. 4 is a cross-sectional view of an active area of a display apparatus according to an exemplary aspect of the present disclosure.

Referring to FIG. 4, a substrate 410 serves to support and protect components of a display apparatus 400 disposed at an upper portion. Since the substrate 410 may be formed of a flexible material having flexibility in recent years, the substrate 410 may be a flexible substrate and may be a film type including one of polyester polymer, silicon polymer, acrylic polymer, polyolefin polymer, and a copolymer thereof.

For example, the substrate 410 may be formed of at least one of polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmetacrylate, cycloolefin copolymer (COC), cycloolefin polymer (COP), polyethylene (PE), polypropylene (PP), polyimide (PI), polymethylmethacrylate (PMMA), polystyrene (PS), polyacetal (POM), polyether ether ketone (PEEK), polyester sulfone (PES), polytetrafluoroethylene (PTFE), polyvinyl chloride (PVC), polycarbonate (PC), polyvinylidene fluoride (PVDF), perfluoroalkyl polymer (PFA), styrene acrylic nitrile copolymer (SAN), and combinations thereof.

A buffer layer may further be disposed on the substrate 410. The buffer layer suppresses permeation of moisture or contaminants through the substrate 410 and planarizes a surface of the substrate 410. The buffer layer is not an essential component and may be omitted depending on a type of the substrate 410 or a type of a thin film transistor 420 disposed on the substrate 410.

The thin film transistor 420 disposed on the substrate 410 includes a gate electrode 422, a source electrode 424, a drain electrode 426, and a semiconductor layer 428.

The semiconductor layer 428 may be configured by amorphous silicon or polycrystalline silicon, but is not limited thereto. The polycrystalline silicon has better mobility than that of amorphous silicon and has low power consumption and excellent reliability so as to be applied to the driving thin film transistor in the pixel.

The semiconductor layer 428 may be configured by an oxide semiconductor. The oxide semiconductor has excellent mobility and uniformity. The oxide semiconductor may be configured by an indium tin gallium zinc oxide (InSnGaZnO) based material which is a quaternary metal oxide, an indium gallium zinc oxide (InGaZnO) based material, an indium tin zinc oxide (InSnZnO) based material, an indium aluminum zinc oxide (InAlZnO) based material, a tin gallium zinc oxide (SnGaZnO) based material, an aluminum gallium zinc oxide (AlGaZnO) based material, a tin aluminum zinc oxide (SnAlZnO) based material which are ternary metal oxides, an indium zinc oxide (InZnO) based material, a tin zinc oxide (SnZnO) based material, an aluminum zinc oxide (AlZnO) based material, a zinc magnesium oxide (ZnMgO) based material, a tin magnesium oxide (SnMgO) based material, an indium magnesium oxide (InMgO) based material, an indium gallium oxide (InGaO) based material which are bimetallic oxides, an indium oxide (InO) based material, a tin oxide (SnO) based material, and a zinc oxide (ZnO), but a composition ratio of individual elements is not limited.

The semiconductor layer 428 may include a source region and a drain region which include n-type or p-type impurities, and a channel between the source region and the drain region, and a low concentration doped region between the source region and the drain region, which is adjacent to the channel.

The source region and the drain region are regions doped with a high concentration of impurities and a source electrode 424 and a drain electrode 426 of the thin film transistor 420 are connected thereto, respectively. As the impurity ion, a p-type impurity or an n-type impurity is used. The p-type impurity may be one of boron (B), aluminum (Al), gallium (Ga), and indium (In) and the n-type impurity may be one of phosphorus (P), arsenic (As), and antimony (Sb), but is not limited thereto.

The channel region of the semiconductor layer 428 may be doped with the n-type impurity or the p-type impurity in accordance with the NMOS or PMOS thin film transistor structure. As the thin film transistor included in the electroluminescent display apparatus according to the exemplary aspect of the present disclosure, the NMOS or the PMOS thin film transistor may be applied.

A first insulating layer 431 is an insulating layer which is configured by a single layer or multiple layers of silicon oxide (SiOx) or silicon nitride (SiNx) and is disposed such that the current flowing in the semiconductor layer 428 does not flow to the gate electrode 422. The silicon oxide has ductility which is lower than that of metal, but is better than that of the silicon nitride and a single layer or multiple layers thereof may be formed depending on the characteristic.

The gate electrode 422 serves as a switch which turns on or off the thin film transistor 420 based on an electrical signal transmitted from the outside through the gate line. The gate electrode 422 may be configured by a single layer or multiple layers of copper (Cu), aluminum (Al), molybdenum (Mo), chrome (Cr), gold (Au), titanium (Ti), nickel (Ni), and neodymium (Nd) which are conductive metals or an alloy thereof, but is not limited thereto.

The source electrode 424 and the drain electrode 426 are connected to the data line and transmit the electric signal, which is transmitted from the outside, from the thin film transistor 420 to the light emitting element 440. The source electrode 424 and the drain electrode 426 may be configured by a single layer or multiple layers of a metal material such as copper (Cu), aluminum (Al), molybdenum (Mo), chrome (Cr), gold (Au), titanium (Ti), nickel (Ni), and neodymium (Nd) which are conductive metals or an alloy thereof, but are not limited thereto.

In order to insulate the gate electrode 422 from the source electrode 424 and the drain electrode 426, a second insulating layer 433 configured by a signal layer or multiple layers of silicon oxide (SiOx) or silicon nitride (SiNx) may be disposed between the gate electrode 422 and the source electrode 424 and the drain electrode 426.

A passivation layer which is configured by an inorganic insulating layer such as silicon oxide (SiOx) or silicon nitride (SiNx) may be further disposed on the thin film transistor 420. The passivation layer may serve to suppress unnecessary electrical connection between components of the passivation layer and suppress contamination or damage from the outside. However, the passivation layer may be omitted in accordance with a configuration and a characteristic of the thin film transistor 420 and the light emitting element 440.

The thin film transistor 420 may be classified into an inverted staggered structure and a coplanar structure depending on the position of the components which configure the thin film transistor 420. In an inverted staggered thin film transistor, a gate electrode is disposed to be opposite to the source electrode and the drain electrode with respect to the semiconductor layer. As illustrated in FIG. 4, in a coplanar thin film transistor 420, the gate electrode 422 is located on the same side as the source electrode 424 and the drain electrode 426 with respect to the semiconductor layer 428.

Even though in FIG. 4, the coplanar thin film transistor 420 has been illustrated, the display apparatus 400 may include an inverted staggered thin film transistor.

For the convenience of description, among various thin film transistors, only a driving thin film transistor is illustrated, but a switching thin film transistor and a capacitor may also be included. When a signal is applied from the gate line, the switching thin film transistor transmits a signal from the data line to the gate electrode of the driving thin film transistor. The driving thin film transistor transmits a current, which is transmitted through a power line by the signal transmitted from the switching thin film transistor, to the anode 442 and controls the emission by the current which is transmitted to the anode 442.

Planarization layers 435 and 437 are disposed on the thin film transistor 420 to protect the thin film transistor 420, relieve a step generated due to the thin film transistor 420, and reduce a parasitic capacitance generated between the thin film transistor 420, the gate line and the data line, and the light emitting elements 440.

The planarization layers 435 and 437 may be formed of one or more materials of acrylic resin, epoxy resin, phenolic resin, polyamides resin, polyimides resin, unsaturated polyesters resin, polyphenylene resin, polyphenylenesulfides resin, and benzocyclobutene, but are not limited thereto.

The display apparatus 400 according to the exemplary aspect of the present disclosure may include a first planarization layer 435 and a second planarization layer 437 which are a plurality of planarization layers 435 and 437 which are sequentially laminated.

For example, the first planarization layer 435 is laminated on the thin film transistor 420 and the second planarization layer 437 is sequentially laminated on the first planarization layer 435.

A buffer layer may be disposed on the first planarization layer 435. The buffer layer is disposed to protect components disposed on the first planarization layer 435. The buffer layer may be configured by a single layer of silicon nitride (SiNx) or silicon oxide (SiOx) or multiple layers of silicon nitride (SiNx) or silicon oxide (SiOx). However, the buffer layer may be omitted in accordance with the configuration and the characteristic of the thin film transistor 420 and the light emitting element 440.

An intermediate electrode 430 is connected to the thin film transistor 420 through a contact hole formed on the first planarization layer 435. The intermediate electrode 430 is laminated so as to be connected to the thin film transistor 420 so that the data line may also be formed to have a double-layered structure.

The data line may be formed to have a structure in which a lower layer formed of the same material as the source electrode 424 and the drain electrode 426 and a layer formed of the same material as the intermediate electrode 430 are connected. Therefore, the data line may be implemented to have a structure with two layers which are connected in parallel, so that a line resistance of the data line may be reduced.

A passivation layer which is configured by an inorganic insulating layer such as silicon oxide (SiOx) or silicon nitride (SiNx) may be further disposed on the first planarization layer 435 and the intermediate electrode 430. The passivation layer may serve to suppress unnecessary electrical connection between components and suppress contamination or damage from the outside. However, the passivation layer may be omitted in accordance with a configuration and a characteristic of the thin film transistor 420 and the light emitting element 440.

The light emitting element 440 disposed on the second planarization layer 437 includes an anode 442, a light emitting unit 444, and a cathode 446.

The anode 442 may be disposed on the second planarization layer 437. The anode 442 is an electrode serving to supply holes to the light emitting unit 444 and is connected to the intermediate electrode 430 through the contact hole on the second planarization layer 437 to be electrically connected to the thin film transistor 420.

The anode 442 may be configured by indium tin oxide (ITO) or indium zinc oxide (IZO) which is a transparent conductive material, but is not limited thereto.

When the electroluminescent display apparatus 400 is a top emission type which emits light to an upper portion on which the cathode 446 is disposed, the electroluminescent display apparatus 400 may further include a reflective layer to cause the emitted light to be reflected from the anode 442 and be more easily emitted to an upper direction where the cathode 446 is disposed.

For example, the anode 442 may have a double-layered structure in which a transparent conductive layer configured by a transparent conductive material and a reflective layer are sequentially laminated or a triple-layered structure in which a transparent conductive layer, a reflective layer, and a transparent conductive layer are sequentially laminated. The reflective layer may be silver (Ag) or an alloy including silver.

A bank 450 disposed on the anode 442 and the second planarization layer 437 may divide an area which actually emits light to define a pixel. The bank 450 is formed by photolithography after forming a photoresist on the anode 442. The photoresist refers to a photosensitive resin whose solubility in a developer is changed by the action of light, and a specific pattern can be obtained by exposing and developing the photoresist. The photoresist may be classified into a positive photoresist and a negative photoresist. The positive photoresist is a photoresist whose solubility of the exposed portion in the developer is increased by the exposure. When the positive photoresist is developed, a pattern from which exposed portions are removed is obtained. The negative photoresist is a photoresist whose solubility of the exposed portion in the developer is significantly lowered by the exposure. When the negative photoresist is developed, a pattern from which non-exposed portions are removed is obtained.

In order to form a light emitting unit 444 of the light emitting element 440, a fine metal mask (FMM) which is a deposition mask may be used. In order to suppress a damage which may be caused by a contact with the deposition mask disposed on the bank 450 and maintain a predetermined distance between the bank 450 and the deposition mask, a spacer (not shown) which is configured by one of polyimide, photoacryl, and benzocyclobutene (BCB) which are transparent organic materials may be disposed above the bank 450. It is not limited to a material for forming the spacer.

The light emitting unit 444 is disposed between the anode 442 and the cathode 446. The light emitting unit 444 serves to emit light and includes at least one layer of a hole injection layer (HIL), a hole transport layer (HTL), an emissive layer, an electron transport layer (ETL), and an electron injection layer (EIL). Some components of the light emitting unit 444 may be omitted depending on the structure or the characteristic of the electroluminescent display apparatus. Here, as the emissive layer, an electroluminescent layer and an inorganic emissive layer may also be applied.

The hole injection layer is disposed on the anode 442 to smoothly inject the holes. The hole injection layer may be formed of one or more of HAT-CN(dipyrazino[2,3-f:2',3'-h] quinoxaline-2,3,6,7,10,11-hexacarbonitrile), CuPc(phthalocyanine), and NPD(N,N'-bis(naphthalene-1-yl)-N,N'-bis(phenyl)-2,2'-dimethylbenzidine).

The hole transport layer is disposed on the hole injection layer to smoothly transmit holes to the emissive layer. For example, the hole transport layer may be formed of one or more of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD(2,2',7,7'-tetrakis(N,N-dimethylamino)-9,9-spirofluorene), and MTDATA(4,4',4"-Tris(N-3-methylphenyl-N-phenyl-amino)-triphenylamine).

The emissive layer is disposed on the hole transport layer and includes a material which emits specific color light to emit specific color light. The light emitting material may be formed using a phosphor or a fluorescent material.

When the emissive layer emits red light, an emitting peak wavelength is in the range of 600 nm to 650 nm. The emissive layer may include a host material including CBP (4,4'-bis(carbazol-9-yl)biphenyl) or mCP(1,3-bis(carbazol-9-yl)benzene) and may be formed of a phosphor material including a dopant including one or more of PIQIr(acac)(bis(1-phenylisoquinoline)(acetylacetonate) iridium), PQIr(acac)(bis(1-phenylquinoline)(acetylacetonate) iridium), PQIr(tris(1-phenylquinoline) iridium), and PtOEP(octaethylporphyrin platinum). Alternatively, the emissive layer may be formed of a fluorescent material including PBD:Eu $(DBM)_3$(Phen) or perylene.

Here, the peak wavelength $\lambda$ refers to a maximum wavelength of electroluminescence (EL). A wavelength at which emissive layers configuring a light emitting unit emit unique light is referred to as photoluminescence (PL) and light emitted by the influence of the thickness or the optical characteristic of layers configuring the emissive layers is referred to as emittance. In this case, electroluminescence (EL) refers to light which is finally emitted by the electroluminescent display apparatus and may be represented by a product of photoluminescence (PL) and emittance.

When the emissive layer emits green light, an emitting peak wavelength is in the range of 520 nm to 540 nm. The emissive layer may include a host material including CBP or mCP and may be formed of a phosphor material including a dopant material including $Ir(ppy)_3$(tris(2-phenylpyridine) iridium) such as Ir complex. Further, the emissive layer may be formed of a fluorescent material including $Alq_3$(tris(8-hydroxyquinolino)aluminum).

When the emissive layer emits blue light, an emitting peak wavelength is in the range of 440 nm to 480 nm. The emissive layer may include a host material including CBP or mCP and may be formed of a phosphor material including a dopant material including FIrPic(bis(3,5-difluoro-2-(2-pyridyl)phenyl-(2-carboxypyridyl)iridium). Alternatively, the emissive layer may be formed of a fluorescent material including any one of spiro-DPVBi(4,4'-Bis(2,2-diphenylethen-1-yl)biphenyl), DSA(1-4-di-[4-(N,N-di-phenyl)amino]styryl-benzene), PFO(polyfluorene) based polymer, and PPV(polyphenylenevinylene) based polymer.

The electron transport layer is disposed on the emissive layer to smoothly move the electrons to the emissive layer.

For example, the electron transport layer may be formed of any one of Liq(8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), spiro-PBD, BCP(2,9-Dimethyl-4,7-diphenyl-1,10-phenanthroline), and BAlq(bis(2-methyl-8-quinolinolate)-4-(phenylphenolato)aluminum).

The electron injection layer may be further disposed on the electron transport layer. The electron injection layer is an organic layer which smoothly injects the electrons from the cathode 446 and may be omitted in accordance with the structure and the characteristic of the electroluminescent display apparatus. The electron injection layer may be a metal inorganic compound such as BaF2, LiF, NaCl, CsF, $Li_2O$, and BaO or one or more organic compounds of HAT-CN(dipyrazino[2,3-f:2',3'-h]quinoxaline-2,3,6,7,10,11-hexacarbonitrile), CuPc(phthalocyanine), and NPD(N,N'-bis(naphthalene-1-yl)-N,N'-bis(phenyl)-2,2'-dimethyl-benzidine).

An electron blocking layer or a hole blocking layer which blocks the flow of holes or electrons is further disposed to be close to the emissive layer. Therefore, a phenomenon that when the electrons are injected to the emissive layer, the electrons move from the emissive layer to pass through an adjacent hole transport layer or when the holes are injected to the emissive layer, the holes move from the emissive layer to pass through an adjacent electron transport layer is suppressed to improve luminous efficiency.

The cathode 446 is disposed on the light emitting unit 444 to supply electrons to the light emitting unit 444. Since the cathode 446 needs to supply electrons, the cathode 446 may be configured by a metal material which is a conductive material having a low work function such as magnesium (Mg) or silver-magnesium (Ag:Mg), but is not limited thereto.

When the electroluminescent display apparatus is a top emission type, the cathode 446 may be indium tin oxide (ITO), indium zinc oxide (IZO), indium tin zinc oxide (ITZO), zinc oxide (ZnO), and tin oxide (TiO) based transparent conductive oxide.

Figure 5:
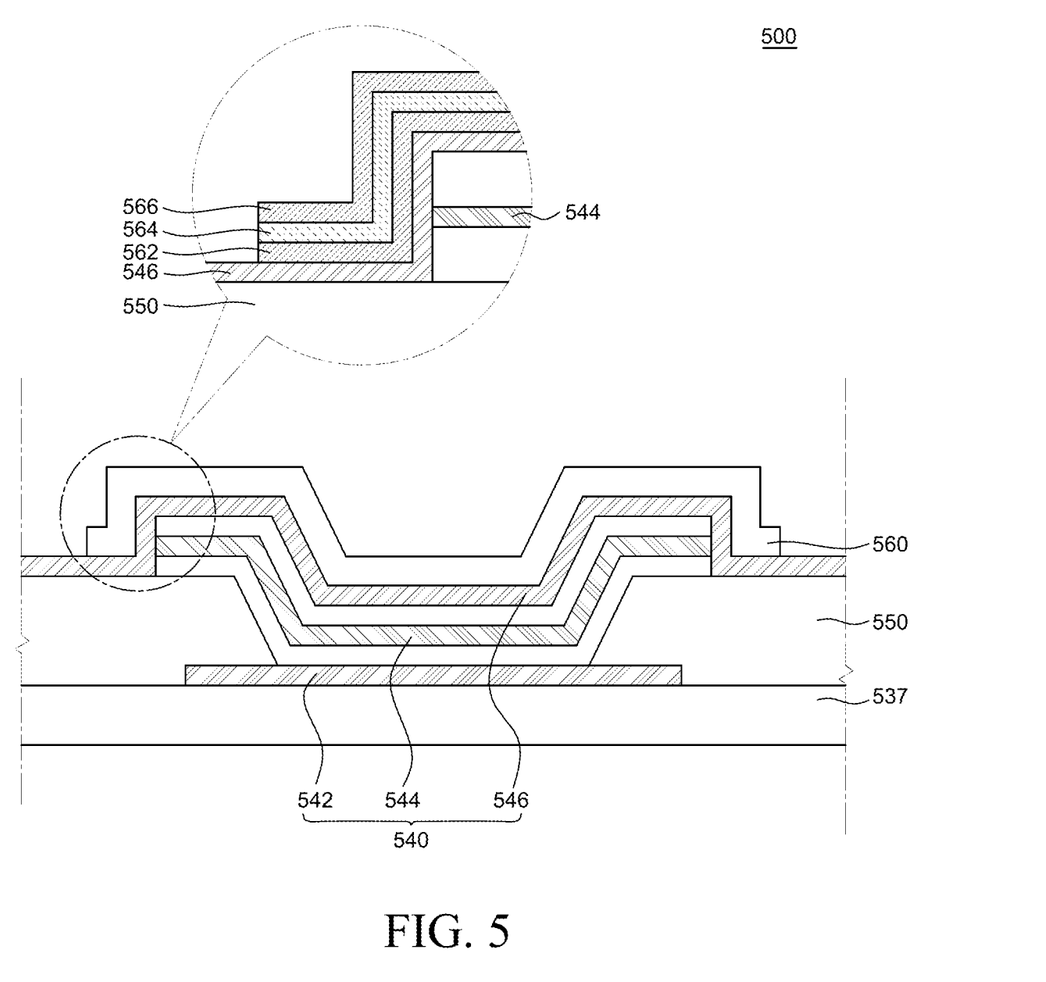
FIGS. 5 to 7 are cross-sectional views of an encapsulating unit of a display apparatus according to an exemplary aspect of the present disclosure.

FIG. 5 is a cross-sectional view of an encapsulating unit of a display apparatus according to an exemplary aspect of the present disclosure.

Referring to FIG. 5, an encapsulating unit 560 is disposed on a light emitting element 540 including an anode 542, a light emitting unit 544, and a cathode 546 described with reference to FIG. 4 to suppress the defect caused by the oxidation or damage of the light emitting element 540 due to moisture, oxygen, or contaminants penetrating from the outside.

The encapsulating unit 560 disposed on the light emitting element 540 is configured such that a first encapsulating layer 562, a second encapsulating layer 564, and a third encapsulating layer 566 which are a plurality of encapsulating layers are sequentially laminated. Each of the first encapsulating layer 562, the second encapsulating layer 564, and the third encapsulating layer 566 is formed of one of silicon oxide (SiOx) and silicon nitride (SiNx). The same inorganic layers are disposed on the light emitting element 540 and are separated from an encapsulating unit of an adjacent light emitting element 540 so as not to be connected so that individual encapsulating units 560 are patterned to have an island shape which is an independent shape.

A bank 550 disposed on the anode 542 and the second planarization layer 537 may divide an area which emits light to define a pixel.

The encapsulating layers 562, 564, and 566 are simultaneously patterned to have the same end at one or two sides thereof. Thicknesses of the encapsulating layers are 1.3 μm to 2 μm, but are not limited thereto.

The cathode 546 in an area adjacent to the encapsulating unit 560 is not exposed to the outside by the components of the electroluminescent display apparatus which are disposed at the upper portion.

The encapsulating unit 560 of the electroluminescent display apparatus 500 according to an exemplary aspect of the present disclosure improves the problem of the integrally disposed encapsulating unit in that the crack generated due to impact applied from the outside is propagated to the surroundings of the encapsulating unit. Therefore, the encapsulating unit may be patterned to have an island shape. By doing this, the crack is not propagated even by the impact applied from the outside through the first encapsulating layer 562, the second encapsulating layer 564, and the third encapsulating layer 566. Therefore, the defect generated due to moisture or contaminants which penetrate from the outside may be avoided.

A barrier film is further disposed on the third encapsulating layer 566 to delay the penetration of the oxygen or moisture from the outside. The barrier film is configured as a film having translucency and both-sided adhesiveness and may be configured by any one insulating material of olefin based, acrylic, and silicon based insulating materials. Further, the barrier film which is configured by any one material of cyclooefin polymer (COP), cycloolefin copolymer (COC), and polycarbonate (PC) may be further laminated, but is not limited thereto.

Figure 6:
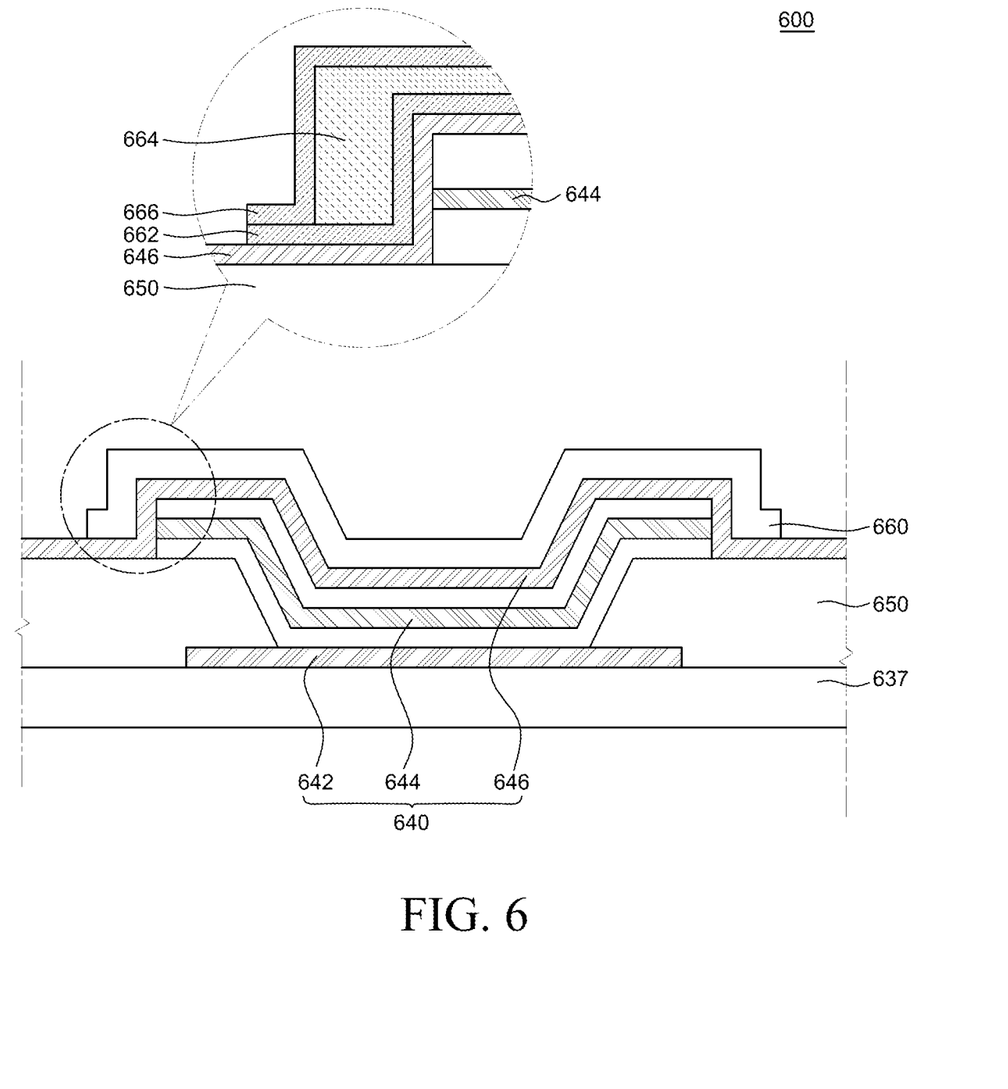

FIG. 6 is a cross-sectional view of an encapsulating unit of a display apparatus according to another exemplary aspect of the present disclosure.

Referring to FIG. 6, an encapsulating unit 660 is disposed on a light emitting element 640 including an anode 642, a light emitting unit 644, and a cathode 646 described with reference to FIG. 4 to suppress the defect caused by the oxidation or damage of the light emitting element 640 due to moisture, oxygen, or contaminants penetrating from the outside.

The encapsulating unit 660 disposed on the light emitting element 640 is configured such that a first encapsulating layer 662, a second encapsulating layer 664, and a third encapsulating layer 666 which are a plurality of encapsulating layers are sequentially laminated. This exemplary aspect is different from the exemplary aspect described with reference to FIG. 5 and the first encapsulating layer 662 and the third encapsulating layer 666 may be configured by inorganic layers configured by one of silicon oxide (SiOx) or silicon nitride (SiNx). The second encapsulating layer 664 disposed between the first encapsulating layer 662 and the third encapsulating layer 666 may serve as a foreign matter compensating layer. When the defect is caused by the crack generated due to foreign matter or particles which may be generated during the process, the foreign matter compensating layer covers the curvature or foreign matters to compensate for the defect. The second encapsulating layer 664 may be silicon oxycarbide (SiOCz), acryl, or epoxy based resin which is an organic material, but is not limited thereto.

The encapsulating unit 660 is patterned on the light emitting element 640 to have an island shape which is not connected to an encapsulating unit 660 of an adjacent light emitting element 640, is isolated and independent therefrom. The first encapsulating layer 662 and the third encapsulating layer 666 are in contact with each other at an end thereof and the second encapsulating layer 664 may be disposed in the first encapsulating layer 662 and the third encapsulating layer 666. As another example, the third encapsulating layer 666 may be disposed on the entire surface of the active area and/or in the non-active area, so as to encompass the first encapsulating layer 662 and the second encapsulating layer 664. Thicknesses of the encapsulating layers are 1.3 µm to 2 µm, but are not limited thereto.

A bank 650 disposed on the anode 642 and the second planarization layer 637 may divide an area which emits light to define a pixel.

The cathode 646 in an area adjacent to the encapsulating unit 660 is not exposed to the outside by the components of the electroluminescent display apparatus which are disposed at the upper portion.

In order to improve the problem of the integrally disposed encapsulating unit in that the crack generated due to impact applied from the outside is propagated to the surroundings of the encapsulating unit, the encapsulating unit 660 of the electroluminescent display apparatus 600 according to an exemplary aspect of the present disclosure may configure the first encapsulating layer 662, the second encapsulating layer 664, and the third encapsulating layer 666 which are patterned to have an island shape. By doing this, the crack is not propagated even by the impact applied from the outside, so that the defect generated due to moisture or contaminants which penetrate from the outside may be avoided.

A barrier film is further disposed on the third encapsulating layer 666 to delay the penetration of the oxygen or moisture from the outside. The barrier film is configured as a film having translucency and both-sided adhesiveness and may be configured by any one insulating material of olefin based, acrylic, and silicon based insulating materials. Further, the barrier film which is configured by any one material of cyclooefin polymer (COP), cycloolefin copolymer (COC), and polycarbonate (PC) may be further laminated, but is not limited thereto.

Figure 7:
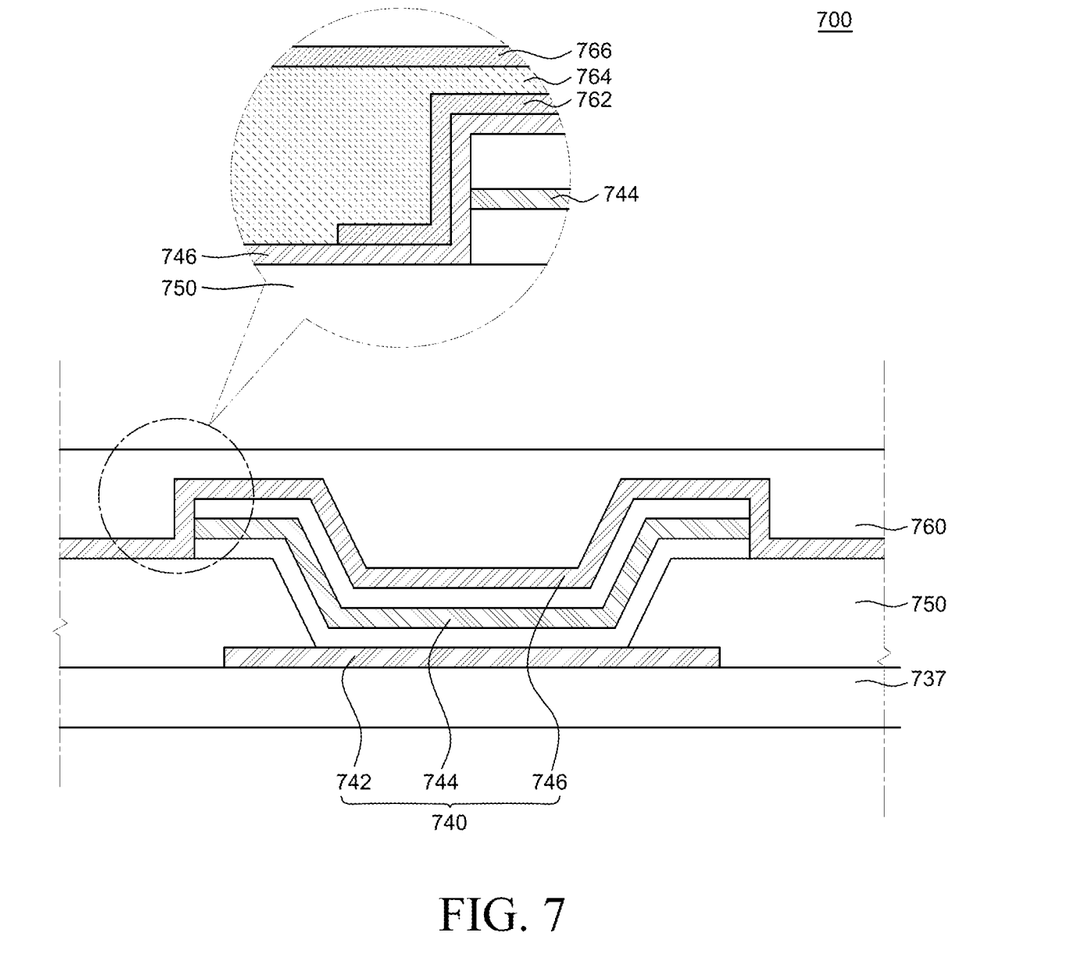

FIG. 7 is a cross-sectional view of an encapsulating unit of a display apparatus according to another exemplary aspect of the present disclosure.

Referring to FIG. 7, an encapsulating unit 760 is disposed on a light emitting element 740 including an anode 742, a light emitting unit 744, and a cathode 746 described with reference to FIG. 4 to suppress the defect caused by the oxidation or damage of the light emitting element 740 due to moisture, oxygen, or contaminants penetrating from the outside. It is to be noted that although FIGS. 5 to 7 show that the encapsulating unit 560, 660 or 760 is disposed on one light emitting element 540, 640 or 740, but aspects of the present disclosure are not limited thereto. For example, one encapsulating unit may be disposed to correspond to two or more light emitting elements which may be referred to a light emitting element group.

The encapsulating unit 760 disposed on the light emitting element 740 is configured such that a first encapsulating layer 762, a second encapsulating layer 764, and a third encapsulating layer 766 which are a plurality of encapsulating layers are sequentially laminated. This exemplary aspect is different from the exemplary aspect described with reference to FIGS. 5 and 6 and a first encapsulating layer 762 and a third encapsulating layer 766 may be configured by inorganic layers configured by one of silicon oxide (SiOx) or silicon nitride (SiNx). The second encapsulating layer 764 disposed between the first encapsulating layer 762 and the third encapsulating layer 766 may serve as a foreign matter compensating layer. When the defect is caused by the crack generated due to foreign matter or particles which may be generated during the process, the foreign matter compensating layer covers the curvature or foreign matters to compensate for the defect. The second encapsulating layer 764 may be silicon oxycarbide (SiOCz), acryl, or epoxy based resin which is an organic material, but is not limited thereto.

The exemplary aspect described with reference to FIG. 7 is different from the exemplary aspect described with reference to FIGS. 5 and 6. The first encapsulating layer 762 included in the encapsulating unit 760 is patterned on the light emitting element 740 so as not to be connected to a first encapsulating layer 762 of an adjacent light emitting element 740, to be isolated to have an independent island shape. The second encapsulating layer 764 and the third encapsulating layer 766 are disposed on the entire surface of the active area and in the non-active area, the third encapsulating layer 766 is disposed on the second encapsulating layer 764 to be covered, but the present disclosure is not limited thereto.

A bank 750 disposed on the anode 742 and the second planarization layer 737 may divide an area which emits light to define a pixel.

The exemplary aspect of the present disclosure described with reference to FIG. 7 may be distinguished from the exemplary aspects described with reference to FIGS. 5 and 6 and the encapsulating unit 760 is disposed above the cathode 746 to protect the cathode and only the first encapsulating layer 762 is patterned to simplify the process. Further, in order to improve the problem in that the crack generated due to impact applied from the outside is propagated to the surroundings of the encapsulating unit, the crack is not propagated by the impact applied from the outside through the first encapsulating layer 662 which is patterned to have an island shape. Therefore, the defect generated by the penetration of moisture or contaminants which penetrate from the outside may be avoided.

A barrier film is further disposed on the third encapsulating layer 666 to delay the penetration of the oxygen or moisture from the outside. The barrier film is configured as a film having translucency and both-sided adhesiveness and may be configured by any one insulating material of olefin based, acrylic, and silicon based insulating materials. Further, the barrier film which is configured by any one material of cyclooefin polymer (COP), cycloolefin copolymer (COC), and polycarbonate (PC) may be further laminated, but is not limited thereto.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display apparatus, comprising:
   a substrate including an active area in which a pixel is disposed and a non-active area enclosing an outer periphery of an edge of the active area;
   a thin film transistor disposed on the active area of the substrate;
   a planarization layer disposed on the thin film transistor;
   a light emitting element disposed on the planarization layer and including an anode, an organic light emitting layer, and a cathode; and
   an encapsulating unit disposed on the light emitting element,
   wherein the encapsulating unit includes a first encapsulating layer, a second encapsulating layer, and a third encapsulating layer,
   wherein the second encapsulating layer is engulfed in between the first encapsulating layer and the third encapsulating layer to prevent the second encapsulating layer from being connected to a corresponding second encapsulating layer of an adjacent light emitting element,
   wherein the first encapsulating layer and the third encapsulating layer include silicon oxide SiOx or silicon nitride SiNx, wherein the second encapsulating layer includes one of silicon oxycarbide (SiOCz), acryl, epoxy based resin, silicon oxide SiOx or silicon nitride SiNx,
   wherein a barrier film configured as a film having translucency and both-sided adhesiveness, is further disposed on the third encapsulating layer,
   wherein the encapsulating unit is disposed on the cathode without engulfing the cathode, and
   wherein the active area is configured to emit light through the thin film transistor and the light emitting element.

2. The electroluminescent display apparatus according to claim 1, wherein the first encapsulating layer and the third encapsulating layer are in contact with each other at an end and engulf the second encapsulating layer therein.

3. The electroluminescent display apparatus according to claim 1, wherein the first encapsulating layer is disposed on each of a plurality of light emitting elements and has a plurality of patterns which are isolated and independent from each other and the second encapsulating layer and the third encapsulating layer are extended to cover the plurality of patterns of the first encapsulating layer.

4. The electroluminescent display apparatus according to claim 3, wherein each of the plurality of patterns has an island shape.

5. The electroluminescent display apparatus according to claim 3, wherein the plurality of patterns are disposed on the plurality of light emitting elements in one-to-one correspondence.

6. The electroluminescent display apparatus according to claim 3, wherein each of the plurality of patterns covers at least one light emitting element among the plurality of light emitting elements.

7. An electroluminescent display apparatus, comprising:
   a substrate including an active area in which a pixel is disposed and a non-active area enclosing an outer periphery of an edge of the active area;
   a thin film transistor disposed on the active area of the substrate;
   a planarization layer disposed on the thin film transistor;
   a light emitting element disposed on the planarization layer and including an anode, an organic light emitting layer, and a cathode; and
   an encapsulating unit disposed on the light emitting element,
   wherein the encapsulating unit includes a first encapsulating layer, a second encapsulating layer, and a third encapsulating layer,
   wherein the second encapsulating layer is engulfed in between the first encapsulating layer and the third encapsulating layer to prevent the second encapsulating layer from being connected to a corresponding second encapsulating layer of an adjacent light emitting element,
   wherein the first encapsulating layer has a plurality of patterns which are separated apart from the first encapsulating layer, the second encapsulating layer and the third encapsulating layer of adjacent encapsulating units,
   wherein the first encapsulating layer and the third encapsulating layer include silicon oxide SiOx or silicon nitride SiNx, wherein the second encapsulating layer includes one of silicon oxycarbide (SiOCz), acryl, epoxy based resin, silicon oxide SiOx or silicon nitride SiNx,
   wherein a barrier film configured as a film having translucency and both-sided adhesiveness, is further disposed on the third encapsulating layer,
   wherein the encapsulating unit is disposed on the cathode without engulfing the cathode, and
   wherein the active area is configured to emit light through the thin film transistor and the light emitting element.

8. The electroluminescent display apparatus according to claim 7, wherein each of the first encapsulating layer, the second encapsulating layer, and the third encapsulating layer has a plurality of patterns which are isolated and independent from each other, and the first encapsulating layer and the third encapsulating layer are in contact with each other at an end and engulf the second encapsulating layer therein.

9. The electroluminescent display apparatus according to claim 7, wherein the second encapsulating layer and the third encapsulating layer are extended to cover the plurality of patterns of the first encapsulating layer.

10. The electroluminescent display apparatus according to claim 7, wherein each of the plurality of patterns has an island shape.

11. The electroluminescent display apparatus according to claim 7, wherein the plurality of patterns are disposed on the plurality of light emitting elements in one-to-one correspondence.

12. The electroluminescent display apparatus according to claim 7, wherein each of the plurality of patterns covers at least one light emitting element among the plurality of light emitting elements.

* * * * *